United States Patent [19]

Shibahara et al.

[11] Patent Number: 5,707,717
[45] Date of Patent: Jan. 13, 1998

[54] ARTICLES HAVING DIAMOND-LIKE PROTECTIVE FILM

[75] Inventors: Masanori Shibahara; Masatoshi Nakayama, both of Saku, Japan

[73] Assignee: TDK Corporation, Tokyo, Japan

[21] Appl. No.: 209,573

[22] Filed: Mar. 10, 1994

Related U.S. Application Data

[63] Continuation-in-part of Ser. No. 961,222, Oct. 15, 1992, abandoned.

[30] Foreign Application Priority Data

Oct. 29, 1991 [JP] Japan .................................. 3-308261
Oct. 29, 1991 [JP] Japan .................................. 3-308264

[51] Int. Cl.⁶ ............................................ C03B 19/02
[52] U.S. Cl. ................... 428/217; 428/212; 428/336; 428/216; 428/408; 428/457; 65/374.12; 65/374.15
[58] Field of Search .............................. 428/408, 216, 428/336, 212, 217, 457; 65/374.12, 374.15

[56] References Cited

U.S. PATENT DOCUMENTS

| | | | |
|---|---|---|---|
| 4,647,494 | 3/1987 | Meyerson et al. | 428/408 |
| 5,008,002 | 4/1991 | Uno et al. | 427/133 |
| 5,026,415 | 6/1991 | Yamamoto et al. | 65/305 |
| 5,032,159 | 7/1991 | Kuwabara et al. | 65/64 |
| 5,045,165 | 9/1991 | Yamashita | 204/192.16 |
| 5,159,508 | 10/1992 | Grill et al. | 360/103 |
| 5,175,658 | 12/1992 | Chang et al. | 360/103 |
| 5,198,285 | 3/1993 | Arai et al. | 428/408 |

FOREIGN PATENT DOCUMENTS 63-277593  11/1988  Japan.
63-307196  12/1988  Japan.

OTHER PUBLICATIONS

TRC News, Jan. 1987, vol. 6–1, p. 7 published by Torey Research Center and translation.

Journal of Applied Physics of Japan, vol. 55, No. 7 (1986), p. 640 and translation.

Journal of the Ceramic Society of Japan, Internation Edition, vol. 98, pp. 607–608 (1990).

Oguri et al "Low Friction Coatings of Diamond Like Carbon with Silicon Prepared by Plasma–Assited Chemical Vapor Deposition" J. Mater, Res vol. 5, No. 11, Nov. 1990 pp. 2567–2571.

*Primary Examiner*—Archene Turner
*Attorney, Agent, or Firm*—Sprung Kramer Schaefer & Briscoe

[57] ABSTRACT

A protectively coated article comprises a substrate of a material selected from the group consisting of alloys containing at least Co, Ni, or Fe, ceramics, and glass and which has only a slight affinity for a diamond-like thin film, an intermediate carbon layer formed on the substrate, the intermediate layer having a hardness Hv in the range from 1000 to 5000 kg/mm2, or harder than the substrate but less hard than a diamond-like thin film to be formed thereon, and a diamond-like thin film formed further thereon. The interposition of the intermediate layer permits the diamond-like thin film to be bound securely to a substrate surface which has a slight affinity for the film.

7 Claims, 1 Drawing Sheet

5,707,717

ARTICLES HAVING DIAMOND-LIKE PROTECTIVE FILM

This application is a continuation-in-part application of application Ser. No. 07/961,222 filed Oct. 15, 1992 and now abandoned.

BACKGROUND OF THE INVENTION

This invention relates to a technique of improving the adhesion or binding properties of a diamond-like thin film with respect to slightly adhesive substrates of articles, such as metallic mold substrates of hardened steel.

"Diamond-like film" or "diamond-like thin film" used herein is defined as an amorphous carbon film having a Raman's absorption at about 1,550 $cm^{-1}$. It should be noted that the diamond-like film is clearly different from diamond film because the latter has a sharp Raman's absorption peak at 1,333 $cm^{-1}$ and is an aggregate of micro crystals. Diamond-like film does not have Raman's absorption peak at 1,333 $cm^{-1}$ and usually such diamond-like film or diamond-like thin film has a Vickers hardness Hv of at least 5,000 $kg/mm^2$, and usually of about 6,000 $kg/mm^2$ or above (refer, e.g., to TRC News, January 1987, Vol. 6-1, page 7, published by Torey Research Center and Journal of Applied Physics of Japan, Vol. 55, No. 7 (1986), page 640).

The diamond-like thin film produced by a vapor phase process has great hardness and outstanding wear resistance, durability, and resistance to corrosive and other attacks. Also it can form coatings on articles of whatever shapes desired. It is therefore useful as protective coatings for articles that require at least one of those beneficial properties.

Methods of manufacturing diamond-like thin films by the vapor phase process are varied (refer, e.g., to HYOMEN KAGAKU (Surface Chemistry), vol. 5, No. 108 (1984), pp. 108–115 "Various methods"). Diamond-like thin films are extensively used as corrosion- and abrasion-resistant protective films over the surfaces of variously shaped articles that need to be protected.

The diamond-like thin films are capable of being bound solidly to substrates of silicon or the like. However, they are not as adhesive to certain types of article substrates and have a common problem of easily coming off from those substrate surfaces upon subjection to external forces. The shortcoming makes the films unable to be fully effective as protective coatings for applications where corrosion resistance or wear resistance is of essential importance. In particular, Fe metals and alloys (e.g., soft steel "STC", stainless steel, and hardened steels "SKD", "SKS"), alloys of other metals such as Co and Ni, glass, and ceramics are known to produce weak bonds between themselves and diamond-like thin films. Iron-based substrates, such as structural and sliding parts, are of the highest industrial utility. Glass and ceramics too have a broad range of applications including sliding members of thermal heads. It is therefore important to improve the adhesiveness of diamond-like thin films to these substrate surfaces on which they are to be formed.

Pretreatment of such substrates has been taught, e.g., by Japanese Patent Application Public Disclosure Nos. 200898/1985, 204695/1985, and 174376/1986.

The molds or dies for injection molding, extrusion, compression molding, etc. of glass and plastics have hitherto been made from cemented carbides. The materials are expensive and require much time and cost to procure and fabricate into the objects. Susceptibility to cracking due to the lack of toughness is another disadvantage. The brittleness of the cemented carbides has to be compensated for and their abrasion resistance be enhanced. To this end, it has been proposed to coat the frictional or sliding surfaces of metallic molds protectively with diamond-like thin films, e.g., by Japanese Patent Application Public Disclosure Nos. 15169/1990, 22012/1990, and 15170/1990. However, the diamond-like thin films do not bind firmly enough to the metallic mold substrate surfaces and, being aggregates of microcrystals, they easily separate from the mold surfaces by dint of external forces. They, therefore, have not proved fully satisfactory as protective coatings for applications where resistance to corrosion and abrasion is essential.

Hardened steels, on the other hand, are available at lower cost and do not require much time and cost for fabrication but the resulting mold surfaces are worn faster and hence have shorter life. The drawback could be overcome by coating the surfaces with a diamond-like thin film formed by a vapor phase process, as proposed, e.g., by the above-mentioned Patent Application Public Disclosure Nos. 15169/1990, 22012/1990, and 15170/1990. However, by the same token, the binding force is insufficient. There are other approaches to the manufacture of diamond-like thin films (refer, e.g., to HYOMEN KAGAKU (Surface Chemistry), vol. 5, No. 108 (1984), pp. 108–115 "Various methods"). Those methods generally require as high a substrate temperatures as 600° C. or upwards, which can anneal the hardened steels and impair the hardness of the resulting molds.

Patent Application Public Disclosure No. 200898/1985 recommends ion etching of a Co-WC alloy substrate surface by direct action of glow discharge before a diamond-like thin film is formed on the surface as a high-hardness film. Since no accelerating voltage is applied, the etching efficiency is not adequately high from the standpoint of enhanced adhesion. Thus the improvement in adhesion to which the present invention is directed is not satisfactorily achieved. Patent Application Public Disclosure No. 204695/1985 likewise aims at an increase in the film-forming rate. The end is attained by introducing Ar gas into a reduced-pressure chamber, applying a voltage across positive and negative electrodes to produce a plasma, and then subjecting a substrate to the plasma action. The plasma ion concentration being low, the etching effect is rather limited for the improvement of adhesion. Public Disclosure No. 174376/1986 intends to improve the adhesion of substrates by treatment with plasma gas and then by oxidation treatment to form an oxide coating. The plasma requires diffusion in the first place so that the positive ions can pass through the positive-potential grid. This makes it impossible for a sufficient amount of positive ions to form a film to reach the substrate, thus rendering the process inefficient. The prior art methods thus have failed to produce a diamond-like thin film with adequately high bond between the film and the substrate. Patent Application Public Disclosure No. 80190/1991 teaches bombardment of a substrate surface with an accelerated ion beam. The technique is advantageous over those described already but is still unable to bring an adequately enhanced adhesion.

Patent Application Public Disclosure No. 174508/1984 sets out the ionization evaporation technique that is utilized in the present invention. The reference specification describes that a thin film of Si, Ti or the like is formed as an intermediate layer over a basis metal plate of Ni, Cu, Fe, Co or the like, and then a diamond-like film is formed thereover to provide a Vickers hardness of about 5000. However, the bases of bulk materials such as iron and steel that contain Fe, Co, etc. and stainless steel are not adequately receptive to the application of the coatings, and the coating film of Si or the like does not achieve satisfactory adhesion strength.

U.S. Pat. No. 4,753,414 (to McCandless) uses RF plasma in forming a carbonaceous coating film over a base. According to a paper written by the inventor and cited in the patent specification, the RF plasma method produced a Vickers hardness of only about 1850. The patent process, therefore, is unable to yield the diamond-like film of the present invention. In addition, the same patent is silent on any intermediate layer.

On the other hand, U.S. Pat. No. 5,112,025 claims that a diamond film can be directly formed on a plating film of Ni, with allegedly ample adhesion. However, the fact is the adhesion is "ample" in the sense that the plating film is capable of withstanding a molding pressure of at most about 400 kg/cm². Apart from this, Ni is originally a hardly adherent metal.

U.S. Pat. No. 4,490,229 (to Mirtish) teaches activating a base by bombardment with neutral Ar to increase the adhesion of a diamond-like film to the base surface. In the absence of accelerating means for the bombarding gas, however, the activation of the base surface is not sufficient for attaining full adhesion, and hence the hardness is unsatisfactory.

None of these printed publications of the prior art suggest that the use of a low-hardness carbonaceous film as an intermediate layer makes it possible to form an excellently adherent and hard diamond-like film on a bulk metal such as stainless steel or steel containing Fe, Co, etc.

In view of the above, we proposed in Patent Application 142678/1991 the use of an Mo intermediate layer for added adhesiveness. The intermediate layer was found to produce very great binding power. We tried other substances for the intermediate layer and attained results comparable to or even better than those of the patent application. Crystalline silicon carbide, nitride, etc. have also been known to form intermediate layers. However, the prior art methods and that of our copending application require the formation of an intermediate layer of a material dissimilar to that which gives the diamond-like film, with a consequent increase in the total number of process steps required. Moreover, the resulting intermediate layers are not fully acceptable yet.

It is therefore an object of the present invention to provide in a relatively simple way articles protected with a diamond-like thin film which is strongly bound to and highly adhesive to the substrate and exhibits improved peeling resistance and durability.

Another object of the invention is to manufacture highly wear-resistant metallic molds from inexpensive hardened steel. Hardened steel has such low thermal resistance and poor adhesion to diamond-like thin films that they have been unable to give diamond-coated metallic molds with industrially adequate wear resistance. Patent Application No. 214913/1989 discloses a technique of forming a diamond-like film by bombardment of a substrate with Ar ions and subsequent ionization evaporation to provide protection for metals and ceramics. It does not teach, however, the application of the technique to the fabrication of metallic molds from hardened steel.

SUMMARY OF THE INVENTION

The invention provides protectively coated articles comprising a substrate of ordinary character, of course, or a substrate, such as of a metallic mold, selected from the group consisting of alloys, e.g., a hardened steel, which contain at least Co, Ni, or Fe, ceramics, and glass, the substrate having a slight affinity for a diamond-like thin film, an intermediate carbon layer formed on the substrate surface, the intermediate layer having a hardness Hv in the range from 1000 to 5000 kg/mm2, or harder than the substrate but less hard than a diamond-like thin film to be formed thereon, and a diamond-like thin film formed as the outer layer. Preferably, the intermediate layer according to the present invention is made harder stepwise or continuously from the side facing the substrate toward the diamond-like thin film.

DETAILED DESCRIPTION OF THE INVENTION

Figure 1:
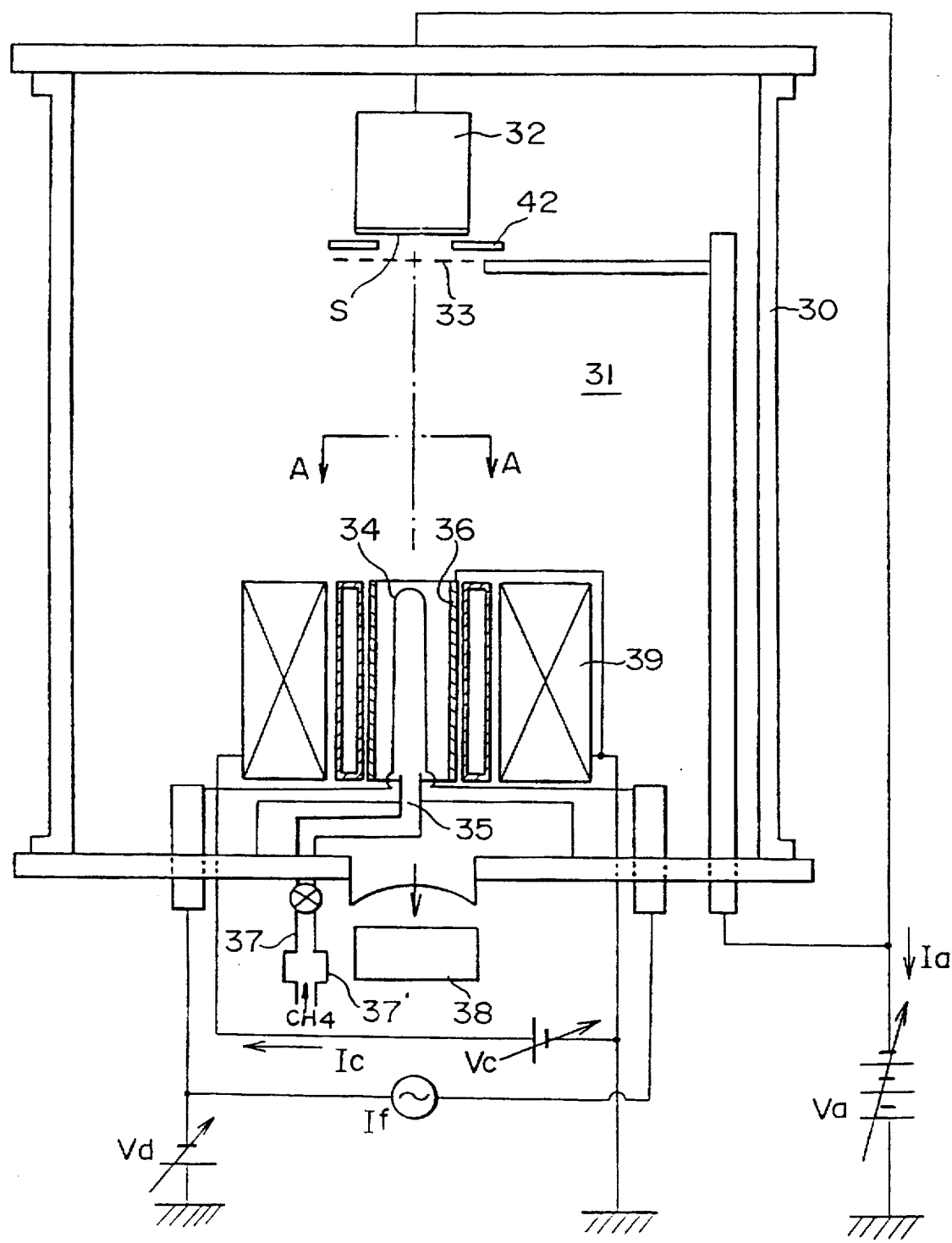
FIG. 1 is a schematic view, in vertical section, of an ionization evaporation apparatus for use in the present invention.

According to this invention, a substrate is coated with an intermediate carbon layer having a greater hardness than the substrate but less than that of the diamond-like thin film to be formed thereon, through control of the deposition conditions of ionization evaporation, and then the diamond-like thin film is formed without changing the material hydrocarbon and using the same ionization evaporation technique excepting changes in the film-forming conditions. It is particularly desirable to change the film-forming conditions for the intermediate layer too, either stepwise or continuously, so that the hardness of the intermediate layer increases from the side facing the substrate toward the diamond-like thin film.

For the formation of the intermediate layer, the ionization evaporation as described in Patent Application Public Disclosure Nos. 174507/1983 and 234396/1989 is utilized. According to the method, the formation of the intermediate layer is immediately followed by that of a diamond-like thin film without exposing the intermediate layer or interrupting the operation but by simply altering the film-forming conditions for the fabrication of the diamond-like film. Consequently, the method of the present invention is highly efficient. The process is preferably preceded by a pretreatment in which the substrate is placed in a vacuum chamber of the film-forming apparatus, a bombarding gas, such as of Ar, is introduced into the chamber and is ionized by ionization means comprising a thermionic cathode filament unit and a counter cathode disposed around the unit, and the resulting ion stream is accelerated by a grid at a lower potential than the counter electrode to bombard and activate the substrate surface.

While an intermediate layer of a uniform composition harder throughout than the substrate and less hard than the diamond-like thin film is acceptable, it is preferably of such a composition that the hardness is low on the side facing the substrate and high on the diamond side. The latter improves the binding and adhesive properties of the layer. Both the intermediate layer and the diamond-like thin film can be formed using the same ionization evaporation apparatus and from the same material, with the only exception that the evaporation conditions are changed continuously or stepwise. The thickness of the intermediate layer is desirably between 0.02 and 3 μm, more desirably between 0.05 and 0.5 μm. A too thin layer is not effective but a too thick layer produces a saturated effect.

The hardness of the diamond-like thin film formed by ionization evaporation is about 6000 kg/mm² or above. The hardness of the article that constitutes the substrate varies with the material but usually ranges from 200 to 3000 kg/mm². This means that the hardness of the intermediate layer may be chosen from the range intermediate between those of the substrate material and the diamond-like thin film, i.e., from between 1000 and 5000 kg/mm².

The diamond-like film having a Vickers hardness over 5,000 kg/mm² and usually over 6,000 kg/mm² has a clear Raman's absorption peak at about 1,550 cm$^{-1}$ while the intermediate layer having a Vickers hardness of less than 5,000 kg/mm² shows a weaker peak at about 1,550 cm$^{-1}$ which disappears with decrease in the hardness as shown at pages 78 and 79 of Journal of the Ceramic Society of Japan, International Edition, Vol. 98, pp. 607–608 (1990), and at page 7 of TRC News 18, (1987).

To form an intermediate layer by ionization evaporation, either a singular or mixed gas is used. To form a diamond-like thin film, the ionization evaporation process comprises ionizing a hydrocarbon feed gas or a feed gas capable of giving a hydrocarbon upon decomposition or reaction by ionization means, such as arc discharge between a thermionic cathode filament unit and a counter cathode or thermionic emission between a thermionic cathode filament unit and a counter cathode and accelerating the resulting ion beam with an electric field and directing it toward a substrate to form a diamond-like thin film thereon. (The term "hydrocarbon" as used herein means a saturated hydrocarbon, such as methane, ethane, or propane, or an unsaturated hydrocarbon, such as ethylene, propylene, or acetylene, etc. The "feed gas capable of giving a hydrocarbon upon decomposition" is, e.g., an alcohol, such as methyl alcohol or ethyl alcohol, or a ketone, such as acetone or methyl ethyl ketone. The "feed gas capable of giving a hydrocarbon upon reaction" is, e.g., carbon monoxide and a mixed gas of carbon dioxide and hydrogen. Such a feed gas may contain at least one chosen from among rare gases, such as helium, neon, and argon, or from among hydrogen, oxygen, nitrogen, water, carbon monoxide, carbon dioxide, etc.) The details of the process are described in Patent Application Public Disclosure Nos. 174507/1983 and 234396/1989. The intermediate layer can be formed by the film-forming procedure for the diamond-like thin film with the exception that film-forming energy level is lowered.

There is shown in FIG. 1 a preferred embodiment of a film-forming apparatus according to Patent Application Public Disclosure No. 174507/1983. Other known ionization evaporation apparatus may, of course, be employed instead. The numeral 30 designates a vacuum vessel and 31 a chamber communicated with an evacuation system 38 to be evacuated up to a high vacuum of about $10^{-6}$ Torr. An electrode 32 is located at the back of a substrate S such as a metallic mold and kept at a negative potential Va. A mask 42 is provided close to or in contact with the front surface of the substrate S, with a window for controlling the size and shape of the diamond-like thin film to be formed. While the mask may be in contact with the substrate, it is preferably located away from the latter so as to reduce the peripheral thickness of the film and decrease the risk of cracking. Indicated at 33 is a grid supplied with the same negative potential Va as for the substrate so as to be used in accelerating the hydrocarbon ions during the film-forming process. To enhance the continuity of the film and smoothen its surface, the grid 33 to be used has a properly chosen porosity (the total area of openings per unit area) and opening density (the number of openings per unit length). It may be equipped with means for causing planar vibrations. A thermionic cathode filament unit 34, kept at a negative potential Vd, is heated by a current If from an AC source to emit thermions. The numeral 35 indicates an inlet for the feed gas, 37 a gas feed passage, and 37' a plasma excitation chamber. An anode 36 surrounds the filament unit 34. The anode, while being grounded in this case, maintains a voltage Vd positive to the filament unit and is given a positive potential Va for the electrode 32 and grid 33. A solenoid 39 is disposed around the filament unit 34, anode 36, and feed inlet 35 so as to be excited by a current Ic from a power supply Vc to produce a magnetic field for the containment of ionized gas. Thus, the quality of film being formed can be modified by adjusting If, Vd, Va, and the solenoid current Ic. Above all, the control of Va (substrate voltage) and Vd (potential difference between the thermionic cathode and the anode) gives good result.

Controlling these film-forming conditions can be easily done under programmed computer control.

The film-forming procedure is as follows. The vacuum chamber 31 is evacuated to about $10^{-6}$ Torr and a valve on the gas feed line 37 is manipulated to admit a gas for forming an intermediate layer or a gas for forming a diamond-like film, or, in some cases, its mixture with hydrogen gas, or with Ar, He, Ne, or other carrier gas, all at predetermined rates, into the chamber through the inlet 35. With concurrent adjustment of the evacuation system 38, a desired gas pressure, e.g., $10^{-1}$ Torr, is secured. Meanwhile, the plurality of thermionic cathode filaments 34 are heated by passage of the AC current If, and the differential potential Vd is applied between the filament unit 34 and the anode 36 to produce a discharge. Feed gas fed via the inlet 35 is thermally decomposed and collides with the thermions from the filaments to give positive ions and electrons. The electrons, in turn, collide with other thermally decomposed particles. This phenomenon is repeated under the containment action by the magnetic field of the solenoid until the feed gas is totally converted to positive ions of the thermally decomposed substance. The positive ions are attracted by the negative potential Va applied to the electrode 32 and the grid 36 and accelerated toward the substrate S. They thus impinge on the substrate and, through a film-forming reaction, produces a diamond-like thin film thereon.

As for the potential, current, temperature and other conditions for the parts involved, refer to the above-given data and also to the printed publications of the above-cited patent applications.

The present invention is illustrated by the following examples.

EXAMPLES

By ionization evaporation were formed intermediate layers on substrates of articles made of SKD11 (hardened steel), SKS2 (hardened steel), and quartz glass ("SUPRASL", the trade designation of a Shin-Etsu Quartz product) under the conditions given in Table 1 and then formed thereon diamond-like thin films again under the conditions given in Table 1.

The filament unit 34 in this case consisted of a coiled filament 3 mm wide, and the gap between the filament and the surrounding electrode 36 was fixed to 8 mm. The grid 33 was vibrated at the rage of 5 mm/min.

The filament current If was 25 A, the filament voltage Vd was made variable, the substrate voltage Va too was variable, and the magnetic flux density of the solenoid was 300 G. Under these conditions, $CH_4$ was introduced, and intermediate layers of varied film thicknesses and then diamond-like thin films 30 µm thick were formed thereon.

TABLE 1

| | Intermediate layer 1 (substrate side) | | | Intermediate layer 2 (diamond-like thin film side) | | | Diamond-like thin film | | |
|---|---|---|---|---|---|---|---|---|---|
| | If | Vd | Va | If | Vd | Va | If | Vd | Va |
| Ex. 1 | 25 | −20 | −300 | — | — | — | 25 | −30 | −900 |
| Ex. 2 | 25 | −20 | −300 | 25 | −30 | −500 | 25 | −30 | −900 |
| Ex. 3 | 25 | −20 | −500 | 25 | −30 | −700 | 25 | −30 | −800 |
| Ex. 4 | 25 | −15 | −300 | 25 | −35 | −500 | 25 | −30 | −700 |
| Comp. Ex. | — | — | — | — | — | — | 25 | −30 | −800 |

The properties of the protective films formed on the articles thus obtained are given in Table 2.

The adhesion strength and scratch hardness values were evaluated as follows. The adhesion strength was determined by bonding a test diamond-like thin film with epoxy resin to a square bar 1 cm² by 10 cm long and then peeling the film from the bar on a tensile tester (trade-named "Tensilon"). The scratch hardness was determined by means of a Scratch Tester, Model CSR-02 manufactured by Rhesca. The values are relative to the standard values given in the first row of Table 1.

| | Intermediate layer | | | | Diamond-like thin film | | Substrate | | | | | |
|---|---|---|---|---|---|---|---|---|---|---|---|---|
| | Substrate side | | Diamond film side | | | | SKD11 | | Quartz glass | | SKS2 | |
| | Thickness μm | Hardness Hv | Thickness μm | Hardness Hv | Thickness μm | Hardness Hv | Adhesion strength | Scratch hardness | Adhesion strength | Scratch hardness | Adhesion strength | Scratch hardness |
| Ex. 1 | 0.1 | 2500 | — | — | 3.0 | 6000 | 1.0 | 1.0 | 1.0 | 1.0 | 1.0 | 1.0 |
| Ex. 2 | 0.1 | 2500 | 0.1 | 4000 | 3.0 | 6000 | 1.3 | 1.2 | 1.4 | 1.2 | 1.4 | 1.2 |
| Ex. 3 | 0.03 | 3000 | 0.03 | 5000 | 3.0 | 5800 | 0.8 | 0.7 | 0.9 | 0.8 | 0.9 | 0.8 |
| Ex. 4 | 0.01 | 2000 | 0.01 | 4000 | 3.0 | 5500 | 0.6 | 0.5 | 0.6 | 0.6 | 0.6 | 0.6 |
| Comp. Ex. | No intermediate layer | | | | 3.0 | 5400 | 0.1 | 0.2 | 0.09 | 0.08 | 0.1 | 0.1 |

Also, the number of shots endurable with each of metallic molds of hardened steel SKD11 for molding ferrite cores 20 mm in diameter was measured. The results are shown in Table 3.

TABLE 3

| | Intermediate layer | | | | Diamond-like thin film | | No. of shots endurable |
|---|---|---|---|---|---|---|---|
| | Substrate side | | Diamond film side | | | | |
| | Thickness um | Hardness Hv | Thickness um | Hardness Hv | Thickness um | Hardness Hv | |
| Ex. 1 | 0.1 | 2500 | — | — | 3.0 | 6000 | 80,000 |
| Ex. 2 | 0.1 | 2500 | 0.1 | 4000 | 3.0 | 6000 | 100,000 |
| Ex. 3 | 0.03 | 3000 | 0.03 | 5000 | 3.0 | 5800 | 70,000 |
| Ex. 4 | 0.01 | 2000 | 0.01 | 4000 | 3.0 | 5500 | 60,000 |
| Comp. Ex. | No intermediate layer | | | | 3.0 | 5400 | 5,000 |

The intermediate layer according to the invention makes it possible to apply a diamond-like thin film to the substrates of molds and other articles normally difficult to bind with it and thereby substantially improve the durability of the articles.

What is claimed is:

1. A protectively coated article which comprises a substrate of a material selected from the group consisting of alloys containing at least Co, Ni, or Fe, ceramics, and glass and which has only a slight affinity for a diamond-like thin film, an intermediate layer formed on the substrate consisting essentially of carbon, said intermediate layer having a hardness Hv in the range from 1000 to 5000 kg/mm$^2$, and harder than the substrate but less hard than a diamond-like thin film to be formed thereon and having a thickness of 0.02 to 3.0 μm, and a diamond-like thin film consisting of amorphous carbon having a clear Raman's absorption peak at about 1,550 cm$^{-1}$ but not having a sharp peak at 1,333 cm$^{-1}$ formed further thereon.

2. The article of claim 1 in which said diamond-like thin film has been formed with the substrate at no greater than 600° C.

3. The article of claim 1 or 2 in which the substrate is a metallic mold constructed of a hardened steel.

4. The article of claim 1 or 2 in which the intermediate layer is made harder stepwise or continuously from the side facing the substrate toward the diamond-like thin film.

5. The article of claim 1 or 2 in which the intermediate carbon layer is formed by bias-applied plasma or ionization evaporation.

6. The article of claim 1 or 2 in which the intermediate layer has a thickness of 0.05 to 0.5 μm.

7. The article of claim 1 or 2, wherein the article is at least one of a mold and die in which the intermediate layer has a thickness of 0.05 to 0.5 μm.

* * * * *